(12) United States Patent
Forlenza et al.

(10) Patent No.: US 7,921,346 B2
(45) Date of Patent: Apr. 5, 2011

(54) VERIFICATION OF ARRAY BUILT-IN SELF-TEST (ABIST) DESIGN-FOR-TEST/DESIGN-FOR-DIAGNOSTICS (DFT/DFD)

(75) Inventors: Donato Orazio Forlenza, Hopewell Junction, NY (US); Orazio Pasquale Forlenza, Hopewell Junction, NY (US); Bryan J. Robbins, Beavercreek, OH (US); Phong T. Tran, Highland, NY (US)

(73) Assignee: International Business Machines Corporation, Armonk, NY (US)

( * ) Notice: Subject to any disclaimer, the term of this patent is extended or adjusted under 35 U.S.C. 154(b) by 223 days.

(21) Appl. No.: 12/262,976

(22) Filed: Oct. 31, 2008

(65) Prior Publication Data

US 2010/0115337 A1 May 6, 2010

(51) Int. Cl.
*G01R 31/28* (2006.01)

(52) U.S. Cl. ............ 714/733; 714/30; 714/36; 714/718; 714/724; 714/726; 714/727; 714/729; 714/734; 714/738; 714/741; 365/200; 365/201; 365/185.01; 711/102; 711/103; 716/4; 716/18

(58) Field of Classification Search .................. None
See application file for complete search history.

(56) References Cited

U.S. PATENT DOCUMENTS

| | | | | |
|---|---|---|---|---|
| 5,212,693 A | * | 5/1993 | Chao et al. | 714/5 |
| 5,642,362 A | * | 6/1997 | Savir | 714/726 |
| 5,661,732 A | * | 8/1997 | Lo et al. | 714/725 |
| 5,961,653 A | | 10/1999 | Kalter et al. | |
| 6,195,776 B1 | * | 2/2001 | Ruiz et al. | 714/738 |
| 6,311,318 B1 | * | 10/2001 | Souef et al. | 716/18 |
| 6,553,527 B1 | | 4/2003 | Shephard, III | |
| 6,671,870 B2 | * | 12/2003 | Souef et al. | 716/18 |
| 6,694,454 B1 | * | 2/2004 | Stanley | 714/30 |
| 2003/0037295 A1 | * | 2/2003 | Galzur et al. | 714/719 |
| 2005/0138514 A1 | * | 6/2005 | Burdine et al. | 714/733 |
| 2005/0229057 A1 | * | 10/2005 | Anderson et al. | 714/726 |
| 2007/0168803 A1 | * | 7/2007 | Wang et al. | 714/726 |
| 2008/0201622 A1 | * | 8/2008 | Hiew et al. | 714/718 |
| 2008/0244341 A1 | * | 10/2008 | Yoshihara | 714/726 |
| 2009/0198461 A1 | * | 8/2009 | Hafed | 702/69 |
| 2009/0265596 A1 | * | 10/2009 | Chen et al. | 714/729 |

OTHER PUBLICATIONS

W.V. Huott et al., Advanced Microprocessor Test Strategy and Methodology,IBM Journal of Research and Development, 1997, p. 1-15, vol. 41,Nos. 4/5, http://www.research.ibm.com/journal/rd/414/huott.html.

* cited by examiner

*Primary Examiner* — John P Trimmings
(74) *Attorney, Agent, or Firm* — Dillon & Yudell LLP

(57) ABSTRACT

A method, system and computer program product for testing the Design-For-Testability/Design-For-Diagnostics (DFT/DFD) and supporting BIST functions of a custom microcode array. Upon completion of the LSSD Flush and Scan tests, the ABIST program is applied to target the logic associated direct current (DC) and alternating current (AC) faults of ABIST array Design-For-Testability/Design-For-Diagnostics DFT/DFD functions that support the microcode array. A LSSD test of the DFT functional combinational logic is performed by applying generated LSSD deterministic test patterns targeting the ABIST design-for-test faults to determine if the DFT supporting the microcode array is functioning correctly. Additional tests may be terminated upon resulting failure of the applied ABIST DFT circuitry surrounding the arrays.

1 Claim, 4 Drawing Sheets

US 7,921,346 B2

VERIFICATION OF ARRAY BUILT-IN SELF-TEST (ABIST) DESIGN-FOR-TEST/DESIGN-FOR-DIAGNOSTICS (DFT/DFD)

BACKGROUND

1. Technical Field

The present invention generally relates to VLSI device testing in general, and in particular to testing the Design-For-Testability/Design-For-Diagnostics (DFT/DFD) and supporting built-in self-test (BIST) structures and functions of a custom microcode array.

2. Description of the Related Art

One of the problems with semiconductor test techniques is associated with the usage of automatic test equipment (ATE) to apply the test patterns at the device's external inputs and measure the responses at the device's external outputs. This approach does not provide a means to adequately detect all of the device's internal defects. Direct access to the internal structures of a device is necessary. This need has led to the development of design-for-test (DFT) and array built-in self-test (ABIST) techniques and methods.

DFT techniques include design rules and constraints aimed at increasing the testability of a design through increased internal test controllability and observability. A well-known form of DFT is level sensitive scan design (LSSD), which involves modifying the internal storage elements of a device such that, in a test mode, the storage elements form individual stages of a shift register for scanning in test data stimuli and scanning out test responses.

One basic method of testing a VLSI device is by the application of the LSSD Flush and Scan test. The LSSD Flush and Scan test are used to determine if scan chains are operational to continue further LSSD testing. If the Flush and Scan tests fail, no further testing is required in a particular test mode or chip configuration, since all subsequent LSSD tests would also fail, therefore, a typical manufacturing test flow would skip out at that point. A current art method of testing a custom microcode array is an Array Built-In Self-Test (ABIST), which is used to provide at-speed testing of embedded arrays and memory elements. For the ABIST test, a controller based on a programmable-state machine is used to algorithmically generate a variety of memory test sequences.

SUMMARY OF ILLUSTRATIVE EMBODIMENTS

Disclosed is a method, system and computer program product for testing the Design-For-Testability/Design-For-Diagnostics (DFT/DFD) and supporting BIST structures and functions of a custom microcode array. Upon completion of the LSSD Flush and Scan tests, a LSSD test of the DFT functional combinational logic is performed by applying generated LSSD deterministic test patterns targeting the ABIST design-for-test to determine if the DFT supporting the microcode array is functioning correctly. Additional tests may be terminated upon resulting failure of the applied ABIST DFT circuitry surrounding the arrays.

The above as well as additional features and advantages of the present invention will become apparent in the following detailed written description.

BRIEF DESCRIPTION OF THE DRAWINGS

The invention itself will best be understood by reference to the following detailed description of an illustrative embodiment when read in conjunction with the accompanying drawings, wherein.

DETAILED DESCRIPTION OF AN ILLUSTRATIVE EMBODIMENT

Figure 1:
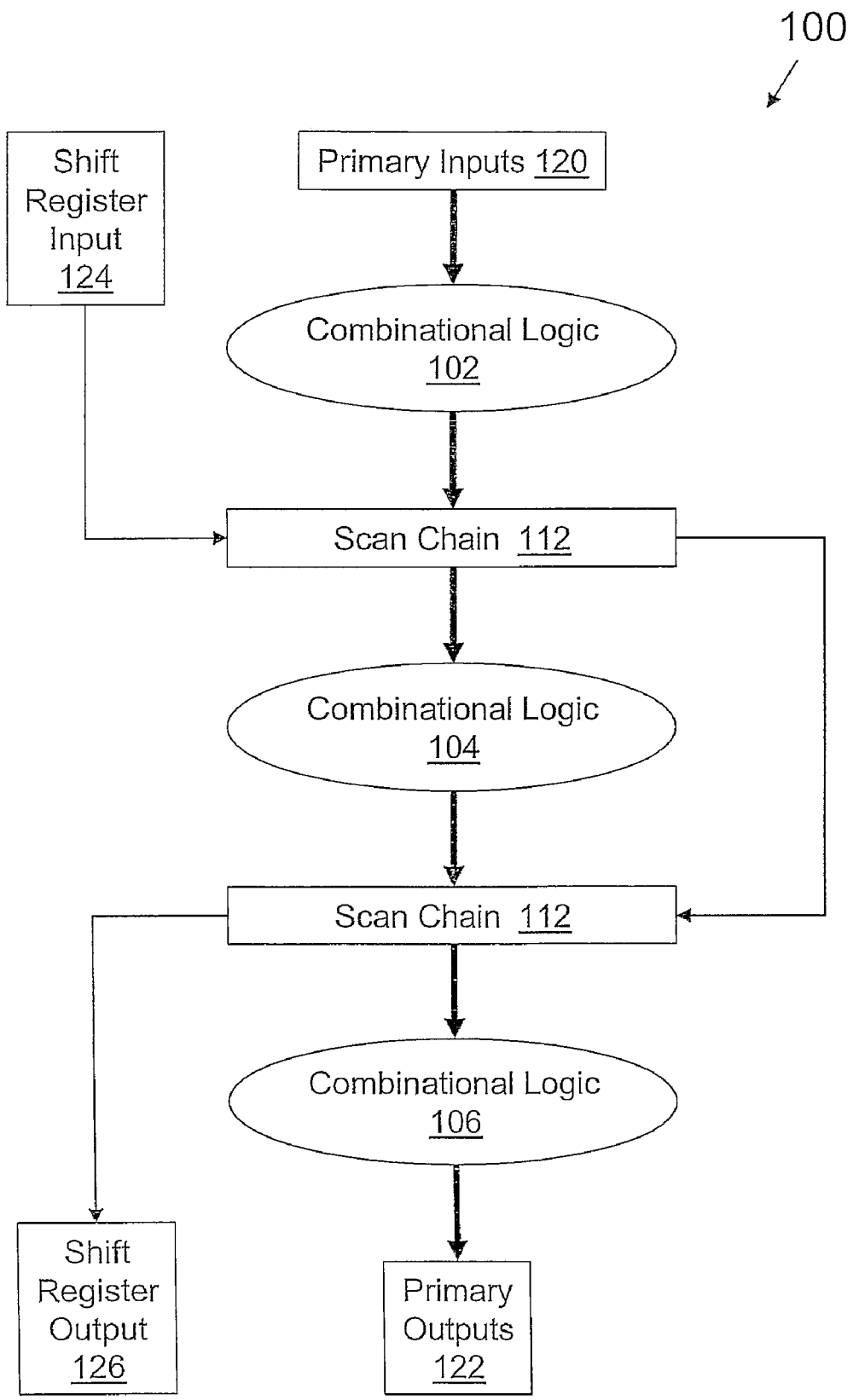
FIG. 1 is a block diagram of an integrated circuit in an LSSD configuration in which a preferred embodiment of the present invention may be incorporated.

The illustrative embodiments provide a method, system and computer program product for testing the Design-For-Testability/Design-For-Diagnostics (DFT/DFD) and supporting ABIST functions of a custom microcode array.

In the following detailed description of exemplary embodiments of the invention, specific exemplary embodiments in which the invention may be practiced are described in sufficient detail to enable those skilled in the art to practice the invention, and it is to be understood that other embodiments may be utilized and that logical, architectural, programmatic, mechanical, electrical and other changes may be made without departing from the spirit or scope of the present invention. The following detailed description is, therefore, not to be taken in a limiting sense, and the scope of the present invention is defined only by the appended claims.

Within the descriptions of the figures, similar elements are provided similar names and reference numerals as those of the previous figure(s). Where a later figure utilizes the element in a different context or with different functionality, the element is provided a different leading numeral representative of the figure number. The specific numerals assigned to the elements are provided solely to aid in the description and not meant to imply any limitations (structural or functional) on the invention.

It is understood that the use of specific component, device and/or parameter names are for example only and not meant to imply any limitations on the invention. The invention may thus be implemented with different nomenclature/terminology utilized to describe the components/devices/parameters herein, without limitation. Each term utilized herein is to be given its broadest interpretation given the context in which that terms is utilized.

With reference now to the drawings, and in particular to FIG. 1, there is illustrated a block diagram of integrated circuit 100 including Design-For-Testability/Design-For-Diagnostics (DFT/DFD) logic in which a preferred embodiment of the present invention may be incorporated. Within integrated circuit 100, DFT/DFD logic is implemented in a level-sensitive scan design (LSSD). Most of the storage elements of the device, such as latches or registers, are concatenated into one or more of scan chains, such as scan chain 112. Other storage elements that are not part of the scan chains, including memory or other special macros, are isolated and tested independently. Combinational logic 102-106 is internally connected to the storage elements of scan chain 112. When integrated circuit 100 is operating in functional mode, signals applied at primary inputs (PIs) 120 are processed and output at primary outputs 122. Scan chain 112 can be accessed externally via serial input 124 and serial output 126. LSSD thereby ensures that all logic feedback paths are gated by one or more of the storage elements in scan chains 112-114, thereby simplifying a sequential logic design into subsets of combinational logic sections (combinational logic 102-106).

Figure 2:
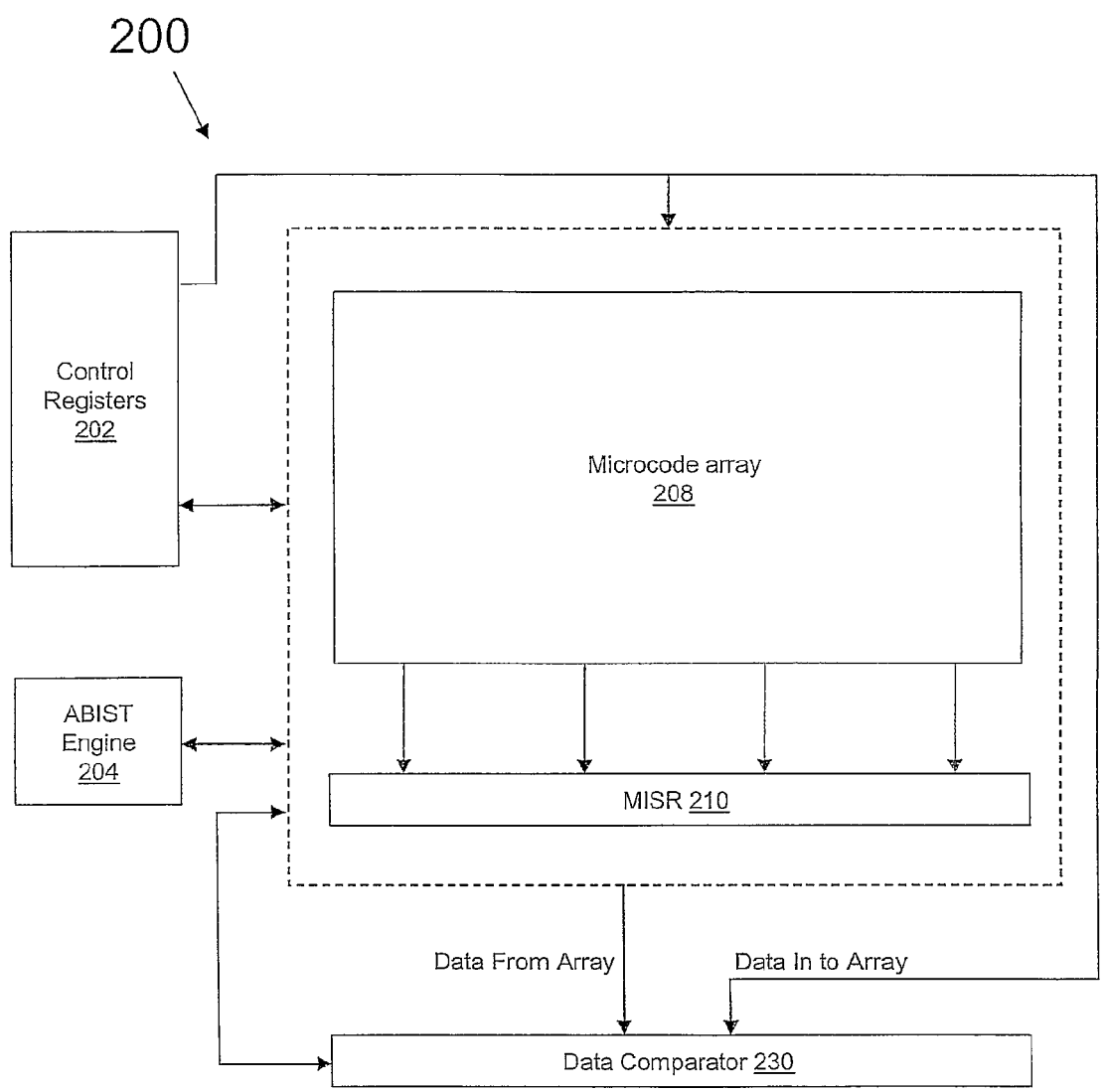
FIG. 2 is a block diagram of an Array Built-In Self-Test (ABIST) Design-For-Testability/Design-For-Diagnostics (DFT/DFD) implementation within an integrated circuit configured for array built-in self testing, in accordance with a preferred embodiment of the present invention.

With reference now to FIG. 2, there is depicted a block diagram of DFT/DFD logic 200 within integrated circuit 100 from FIG. 1, in accordance with a preferred embodiment of the present invention. As shown, DFT/DFD logic 200 is configured into ABIST mode configuration to support ABIST testing. Multiple input signature register (MISR) 210 is used to generate a unique signature representing the responses from the combinational logic. Ideally, the signature for each failing device-under-test is different from the signature of a known-good device after a predefined number of test cycles.

Control registers 202 comprise registers such as data, address, and pointer control registers for loading and controlling data in to the microcode array 208. The data output of microcode array 208 is loaded serially into MISR 210, forming a signature representing compressed data. The signaling for the ABIST test sequence is controlled by ABIST engine 204. Since a typical system design may consist of several system clocks and various path delays, on-product clock generator (OPCG, not pictured) may apply the clock test sequence and timing set-up multiple times with difference clock combinations and timings. An ABIST test sequence consists of a relatively large number of load/unload sequences followed by the system clock cycle. At the end of the test interval, the signature in MISR 210 is unloaded and compared within data comparator 230 to an expected signature. Several signature intervals may be applied to achieve the desired test coverage.

Figure 3:
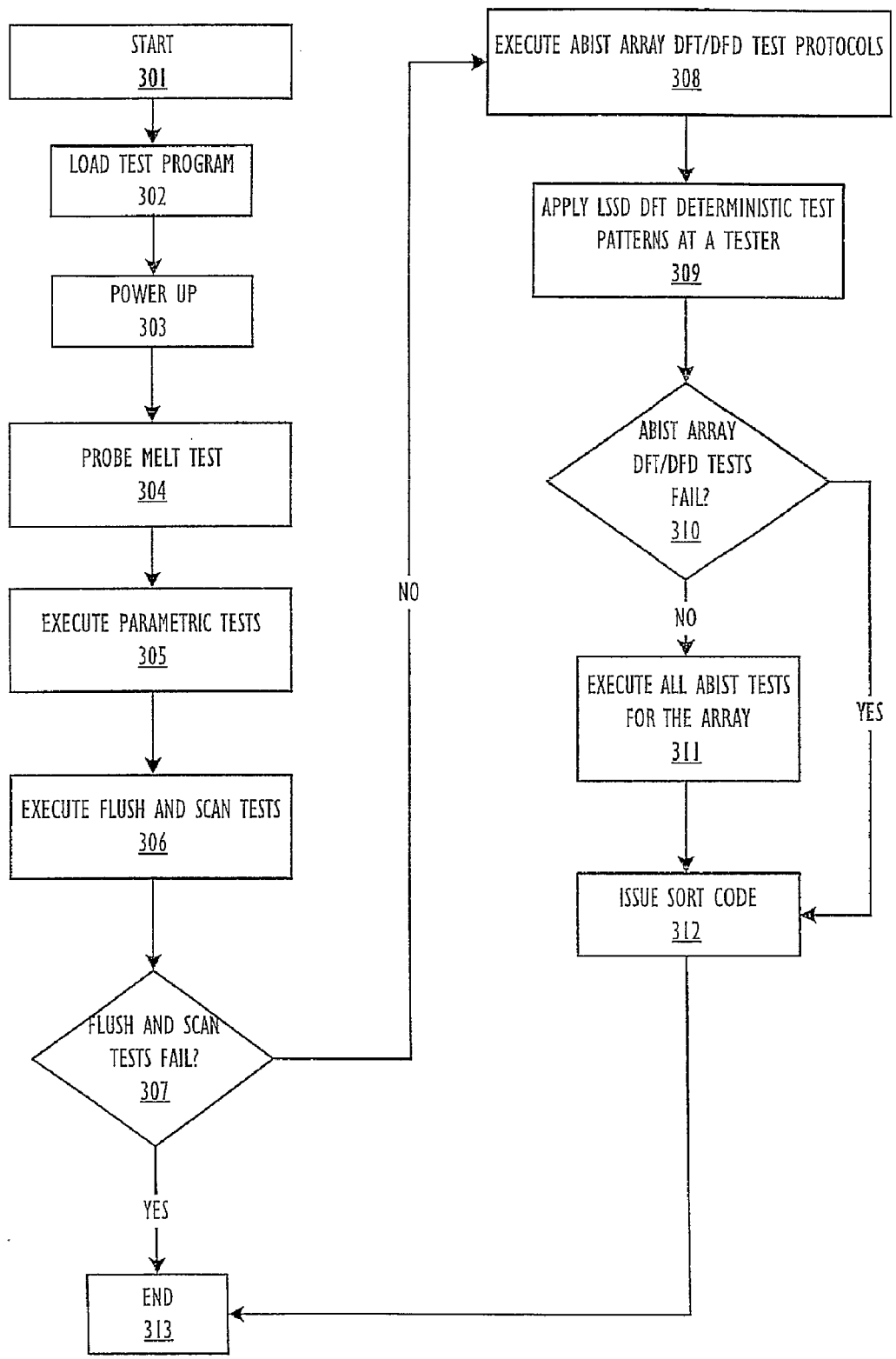
FIG. 3 is a flow chart of the process by which the features of the invention are implemented, according to one embodiment of the invention.

The process of FIG. 3 begins at initiator block 301, and proceeds to block 302, at which time a test program is scanned into a custom microcode array test, block 302. In block 303 the system is powered up.

A probe melt test is applied, block 304, and parametric tests are executed, block 305. Conventional Level-Sensitive Scan Design (LSSD) Flush and Scan tests are conducted, block 306. A determination is made regarding whether the Flush and Scan tests fail, block 307. If the Flush and Scan tests fail, the process ends, block 313. If the Flush and Scan tests do not fail, ABIST array DFT/DFD test protocols are executed, block 308. LSSD deterministic test patterns that target the DFT/DFD are then be applied at a tester, block 309.

Each instruction of the ABIST program is decoded, executed, and applied to the microcode array by the ABIST microprocessor. A typical programmable ABIST design comprises basic components, such as the microcode array, pointer control macro registers, address control macro registers, data control macro registers, read/write registers, result compression macro registers, test control interface logic, and access timer macro. The Design-For-Testability/Design-For-Diagnostics (DFT/DFD) array self-test circuitry also includes, but is not limited to, ABIST array logic functions, such as ABIST Engine, Self-Test Control Macro (STCM) logic, ABIST done signal logic, and all associated ABIST Control logic functions. A determination is made regarding whether the ABIST array DFT/DFD tests fail, block 310. If the ABIST array DFT/DFD tests fail, there is no need to continue testing the particular core or chiplet, since all subsequent ABIST array tests utilizing these functions will also fail. If the ABIST array DFT/DFD tests fail, that process continues to block 312, at which sort code is issued, and the process ends, block 313. If the ABIST array DFT/DFD tests do not fail, all ABIST test protocols for the array are executed, block 311. A sort code is then issued, block 312, and the process ends, block 313.

Figure 4:
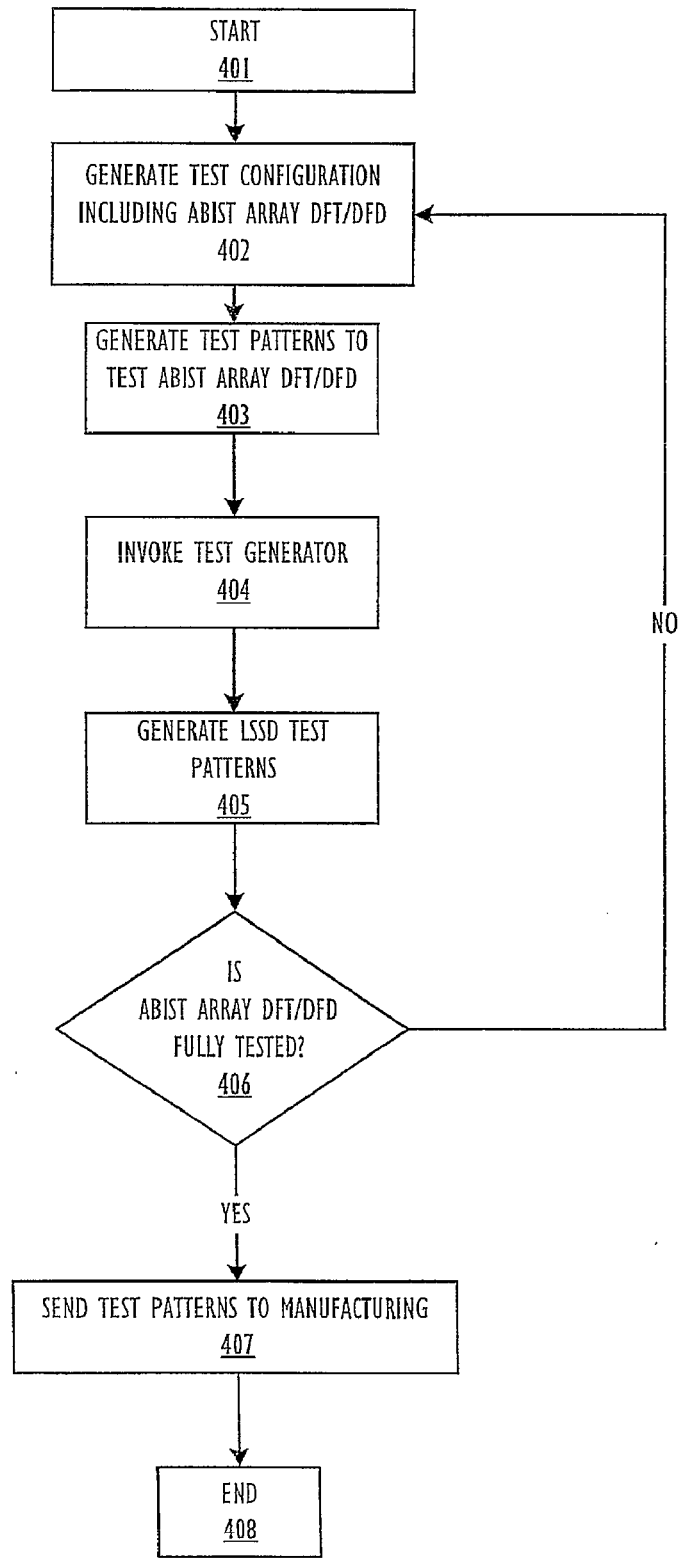
FIG. 4 is a flow chart of the test generation of ABIST array Design-For-Testability/Design-For-Diagnostics (DFT/DFD) process by which the features of the invention are implemented, according to one embodiment of the invention.

FIG. 4 is a flow chart showing a test generation process to target Array Built-In Self-Test (ABIST) array Design-For-Testability/Design-For-Diagnostics (DFT/DFD) and logic circuit in support of array testing. The process of FIG. 4 begins at initiator block 401, and proceeds to block 402, at which test configuration is created or generated that includes ABIST array DFT/DFD, block 302. Test patterns to test ABIST array DFT/DFD are created, block 403. Test patterns for testing ABIST array DFT/DFD can be created using test generation software or can be created manually. The test generator is invoked, block 404. The test generator targets all of the logic and its associated direct current (DC) and alternating current (AC) faults for all of the ABIST array DFT/DFD functions, such as stuck-at-0, stuck-at-1, slow-to-rise, and slow-to-fall. This can be performed by any test generation system in order to deterministically test each logic block of said ABIST array DFT/DFD circuits in a structural test methodology. The Level-Sensitive Scan Design (LSSD) deterministic test patterns will be generated, block 405. The LSSD deterministic test patterns are applied after the traditional LSSD Flush and Scan tests to ensure scan chain functionality.

A determination is made regarding whether the ABIST array DFT/DFD is fully tested, block 406. If the ABIST array DFT/DFD is not fully tested, the process repeats to generate test configuration at block 402. If the ABIST array DFT/DFD is fully tested, test patterns are sent to manufacturing, block 407, and the process ends, block 408.

In an alternate embodiment, redundant ABIST array DFT/DFD functions are provided on-chip that could be multiplexed in to provide valid ABIST array DFT/DFD functions that would mitigate the failed ABIST array DFT/DFD functions. This would potentially increase chip yield where only the ABIST array DFT/DFD circuitry is bad and the core/chiplet array memory elements are potentially good. The greater the number of cores/chiplets, the more benefit is achieved by the invention for improved test time reduction (TTR), potential increase in yield, and better diagnostic granularity. It is understood that the invention is applicable to any very-large-scale integration (VLSI) device employing any form or level of ABIST array DFT/DFD within the design and is technology independent.

In the flow charts, methods are embodied in a computer readable medium containing computer readable code such that a series of steps are performed when the computer readable code is executed on a computing device. In some implementations, certain steps of the methods are combined, performed simultaneously or in a different order, or perhaps omitted, without deviating from the spirit and scope of the invention. Thus, while the method steps are described and illustrated in a particular sequence, use of a specific sequence of steps is not meant to imply any limitations on the invention. Changes may be made with regards to the sequence of steps without departing from the spirit or scope of the present invention. Use of a particular sequence is therefore, not to be taken in a limiting sense, and the scope of the present invention is defined only by the appended claims.

As will be further appreciated, the processes in embodiments of the present invention may be implemented using any combination of software, firmware or hardware. As a preparatory step to practicing the invention in software, the programming code (whether software or firmware) will typically be stored in one or more machine readable storage mediums such as fixed (hard) drives, diskettes, optical disks, magnetic tape, semiconductor memories such as ROMs, PROMs, etc., thereby making an article of manufacture in accordance with the invention. The article of manufacture containing the programming code is used by either executing the code directly from the storage device, by copying the code from the storage device into another storage device such as a hard disk, RAM, etc., or by transmitting the code for remote execution using transmission type media such as digital and analog communication links. The methods of the invention may be practiced by combining one or more machine-readable storage devices containing the code according to the present invention with appropriate processing hardware to execute the code contained therein. An apparatus for practicing the invention could be one or more processing devices and storage systems containing or having network access to program(s) coded in accordance with the invention.

Thus, it is important that while an illustrative embodiment of the present invention is described in the context of a fully functional computer (server) system with installed (or executed) software, those skilled in the art will appreciate that the software aspects of an illustrative embodiment of the present invention are capable of being distributed as a program product in a variety of forms, and that an illustrative embodiment of the present invention applies equally regardless of the particular type of media used to actually carry out the distribution. By way of example, a non exclusive list of types of media includes recordable type (tangible) media such as floppy disks, thumb drives, hard disk drives, CD ROMs, DVDs, and transmission type media such as digital and analogue communication links.

While the invention has been described with reference to exemplary embodiments, it will be understood by those skilled in the art that various changes may be made and equivalents may be substituted for elements thereof without departing from the scope of the invention. In addition, many modifications may be made to adapt a particular system, device or component thereof to the teachings of the invention without departing from the essential scope thereof. Therefore, it is intended that the invention not be limited to the particular embodiments disclosed for carrying out this invention, but that the invention will include all embodiments falling within the scope of the appended claims. Moreover, the use of the terms first, second, etc. do not denote any order or importance, but rather the terms first, second, etc. are used to distinguish one element from another.

What is claimed is:

1. A method for testing DFT/DFD structures surrounding a custom microcode array, comprising:
   scanning an Array Built-In Self-Test (ABIST) test pattern into a microcode array test circuitry;
   conducting conventional Level-Sensitive Scan Design (LSSD) Flush and Scan tests;
   upon successful completion of the LSSD Flush and Scan tests, invoking a test generator performing the steps of:
      generating LSSD deterministic test patterns, and
      applying the LSSD deterministic test patterns at a Design-For-Testability/Design-For-Diagnostics (DFT/DFD) test circuit;
   targeting logic associated with direct current (DC) and alternating current (AC) faults for array ABIST Design-For-Testability/Design-For-Diagnostics (DFT/DFD) functions surrounding the microcode array; and
   terminating further array ABIST tests upon resulting failure of the conducted LSSD Flush and Scan tests.

* * * * *